United States Patent
Suzuki et al.

[11] Patent Number: 6,133,162
[45] Date of Patent: *Oct. 17, 2000

[54] METHOD OF FORMING A FILM BY USING PLASMANIZED PROCESS GAS CONTAINING GASEOUS $H_2O$ AND AN AUXILIARY GAS IN A SEMICONDUCTOR DEVICE

[75] Inventors: Setsu Suzuki; Junichi Aoki; Kazuo Maeda, all of Tokyo, Japan

[73] Assignees: Canon Sales Co., Inc.; Semiconductor Process Laboratory Co., Ltd., both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/897,439

[22] Filed: Jul. 21, 1997

[30] Foreign Application Priority Data

Nov. 29, 1996 [JP] Japan .................................. 8-319868

[51] Int. Cl.[7] .......................... H01L 21/31; H01L 21/469
[52] U.S. Cl. ....................... 438/780; 438/781; 438/788; 438/789; 438/790
[58] Field of Search ................... 438/780, 781, 438/787–790, 798, 905, 770–774, 778

[56] References Cited

U.S. PATENT DOCUMENTS

| | | |
|---|---|---|
| 5,314,724 | 5/1994 | Tsunkune et al. ...................... 427/489 |
| 5,525,550 | 6/1996 | Kato ......................................... 438/788 |
| 5,543,017 | 8/1996 | Uchiyama et al. ..................... 204/169 |
| 5,569,497 | 10/1996 | Verzaro et al. ......................... 427/489 |
| 5,616,369 | 4/1997 | Williams et al. ....................... 427/536 |
| 5,633,424 | 5/1997 | Graves et al. .......................... 588/227 |
| 5,654,054 | 8/1997 | Tropsha et al. ....................... 428/36.6 |
| 5,707,895 | 1/1998 | Wuu et al. .............................. 438/158 |
| 5,763,018 | 6/1998 | Sato ....................................... 427/535 |

FOREIGN PATENT DOCUMENTS

| | | |
|---|---|---|
| 4414263 | 4/1994 | Germany . |
| 98032 | 1/1997 | Japan . |

OTHER PUBLICATIONS

Bright et al, "Low–Rate Plasma Oxidation of Si in a Dilute Oxygen/Helium Plasma for Low–Temperature Gate Quality Si/SiO2 Interfaces" Applied Physics Letters, Vo. 58, No. 6. Feb. 11, 1991, pp. 619–621.

Primary Examiner—Charles Bowers
Assistant Examiner—Thanh Nguyen
Attorney, Agent, or Firm—Lorusso & Loud

[57] ABSTRACT

There is provided a film forming pre-treatment method used when silicon containing insulating film, etc. are to be formed by virtue of thermal CVD method on a substrate 101 on which interconnection layers, etc. are formed. Before an insulating film is deposited on the substrate 101, gaseous $H_2O$ is plasmanized and then a surface of the substrate 101 is exposed to such plasmanized $H_2O$.

17 Claims, 7 Drawing Sheets note) an area surrounded by a brokenline indicates processes conducted continuously in the same chamber

METHOD OF FORMING A FILM BY USING PLASMANIZED PROCESS GAS CONTAINING GASEOUS H₂O AND AN AUXILIARY GAS IN A SEMICONDUCTOR DEVICE

BACKGROUND OF THE INVENTION

1. Field of the Invention

The present invention relates to a film forming pre-treatment method and a semiconductor device manufacturing method and, more particularly, a film forming pre-treatment method used when silicon containing insulating film, etc. are to be formed by thermal CVD method on a substrate on which interconnection layers, etc. are formed and a semiconductor device manufacturing method employing the film forming pre-treatment method.

2. Description of the Prior Art

In the prior art, in the middle of manufacturing process of the semiconductor device, the $SiO_2$ film is to be formed on the wafer by thermal reaction at atmospheric pressure or low pressure while using the reaction gas including TEOS representative of organic silane and ozone representative of oxygen containing gas. In such case, it has been well known that remarkably abnormal results are caused during or after film-forming process if a deposited surface is contaminated by foreign material, etc. For the purposes of example, there have been detected reduction in film forming rate, formation of porous film, reduction in etching rate of the film, abnormal shapes of the film shown in FIGS. 1A to 1E, etc.

Where film forming conditions are subject to the influence of surface condition of the substrate is called "surface dependency" in film formation by the CVD method. Factors which exert a bad influence upon film formation by CVD method using the reaction gas including organic silane and ozone, include absorption of moisture to the surface, charging, uneven distribution of charging which is ready to occur if the conductive film and the insulating film are mixedly formed, residue of organic matter or nitride such as resist residual, metallic contamination, etc.

In order to suppress such surface dependency, countermeasures have been taken as follows. In other words, in a flowchart in FIG. 2 including routines (A) and (B) and illustrating various processes from film forming pre-treatment to termination of film formation, 1) the deposited surface is covered in advance with an insulating film formed by making use of low concentration ozone as oxygen containing gas, as shown in the routine (A), to thus shield from surface contamination, or 2) the deposited surface is covered previously with an insulating film formed by plasma CVD method (PECVD method), as shown in the routine (B), to thus shield from surface contamination.

Meanwhile, according to the above countermeasures, plasma irradiation process and coating of the insulating film formed by plasma CVD method are especially effective. However, if the surface has been contaminated to a considerable extent, such countermeasures fail to remove contamination of the ground surface sufficiently so that influence of such contamination cannot be suppressed sufficiently.

In this case, upon coating the insulating film by of plasma CVD method, surface dependency can be suppressed to a considerable level if the thickness of the insulating film is increased. But such thicker insulating film is not suited to current trends demanding miniaturization of the semiconductor device and therefore a thickness of the insulating film is made as thin as possible. In addition, if unevenly distributed charges exist on the surface, this countermeasure fails to shield from contamination by means of coating of the insulating film and as a result, abnormal film formation cannot be prevented.

SUMMARY OF THE INVENTION

The present invention has been made in view of the above problem in the prior art, and it is an object of the present invention to provide a film forming pre-treatment method capable of suppressing surface dependency of a substrate in a film-forming process, due to surface contamination, by cleaning a surface of the substrate even if the surface of the substrate has been contaminated considerably prior to the film-formation process which is to be carried out by the thermal CVD while using a reaction gas including an organic silane and an oxygen containing gas, etc. and a semiconductor device manufacturing method employing such film forming pre-treatment method.

According to the film forming pre-treatment method and the semiconductor device manufacturing method of the present invention, contaminants can be removed from the surface of the substrate since gaseous $H_2O$ is plasmanized and film forming pre-treatment of the surface of the substrate is carried out by plasma.

At this time, heating of the substrate may accelerate the contaminant removing reaction.

Accordingly, surface dependency of film formation on the surface of the substrate can be reduced. As a result, if the silicon containing film is formed by the thermal CVD method directly on the substrate or via the silicon containing insulating film formed by plasma CVD on the substrate, the shape of the silicon containing insulating film formed by thermal CVD can be improved.

In particular, in the event that patterned conductive films have been formed on the ground insulating film as the surface layer of the substrate, especially on the silicon oxide film formed by thermal oxidation, surface dependency which is different between the conductive film and the silicon oxide film formed by thermal oxidation can be made uniform by coating the surface of the substrate with the insulating film by plasma CVD after surface cleaning. Therefore, it is possible to make uniformly thick the silicon containing insulating film which is to be formed later by thermal CVD on the insulating film which has been formed by plasma CVD.

Still further, if the process gas is prepared by adding an auxiliary gas, e.g., oxygen, $N_2O$, nitrogen, argon, or other inert gas, to the gaseous $H_2O$, such auxiliary gas may serve to stabilize the plasma condition when the process gas is plasmanized. Therefore, contaminants can be removed from the surface of the substrate with good reproducibility.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1A:
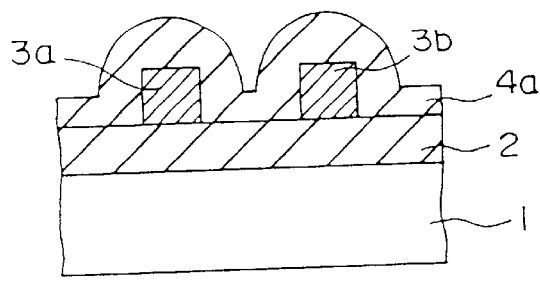
FIGS. 1A to 1E are sectional views showing abnormal shapes of a silicon oxide film formed according to a film forming pre-treatment method and a semiconductor device manufacturing method in the prior art.
Figure 1B:
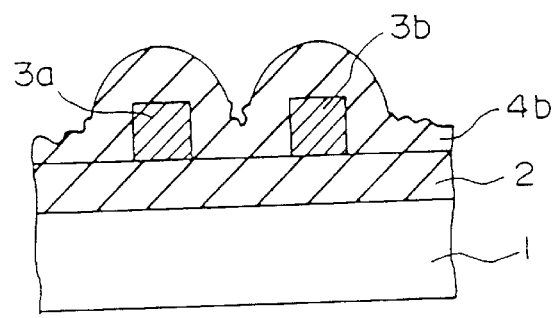

Various embodiments of the present invention will be described with reference to accompanying drawings hereinafter. It should be noted that the same or similar reference numerals are applied to the same or similar parts and elements throughout the drawings, and that repeated description of the same or similar parts and elements will be omitted or simplified.

Plasma equipments used to carry out a film forming pre-treatment method according to embodiments of the present invention will be explained with reference to FIGS. 3A to 3D hereinbelow.

It is preferable not to expose a processed surface, which is cleaned and the quality of which is improved, to the ambient air after film forming pre-treatment and before film forming by of thermal CVD. For this reason, such processed surface would be often covered with an insulating film by plasma CVD after such pre-treatment and before the film forming process. In this case, films must be formed successively in the same chamber under the condition that a substrate is not exposed to the exterior air after such film forming pre-treatment. Hence, respective plasma equipments are employed commonly as both a pre-treatment equipment for irradiating plasma in the film forming pre-treatment and a film forming equipment for forming an insulating film by virtue of plasma CVD method.

Figure 3A:
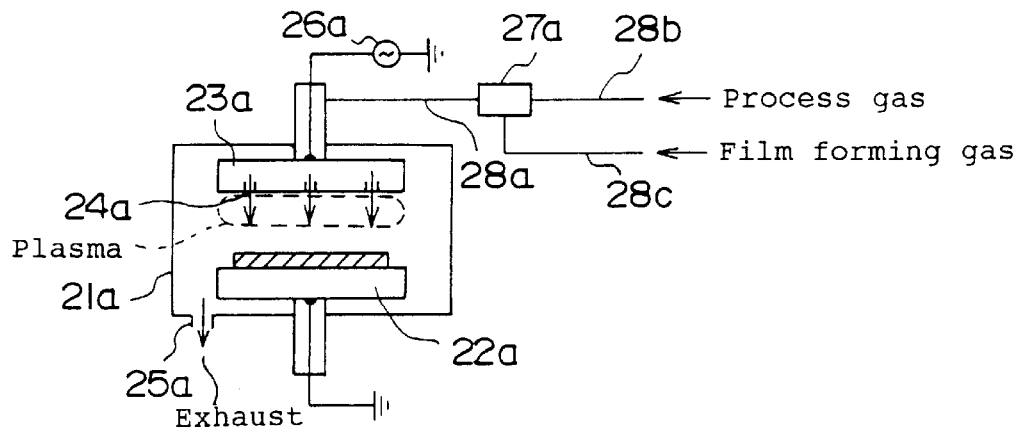
FIGS. 3A to 3D are schematic side views showing plasma equipments for use in a film forming pre-treatment method and a semiconductor device manufacturing method according to embodiments of the present invention.

FIG. 3A shows a parallel plate type plasma equipment of anode coupling system. A lower electrode 22a and an upper electrode 23a are provided so as to oppose to each other. The lower electrode 22a is grounded. A high frequency power supply 26a of a frequency of 13.56 MHz or 100 kHz is connected to the upper electrode 23a. A gas piping 28a is connected to a chamber 21a. A gas switching means 27a is provided to the gas piping 28a to switch its connection to either a process gas introducing piping 28b or a film forming gas introducing piping 28c. Since plasma is generated remotely from a substrate 101, ions which are accelerated by the sheath voltage are hard to enter into a surface of the substrate 101. Accordingly, chemical etching would be effected dominantly.

Figure 3B:
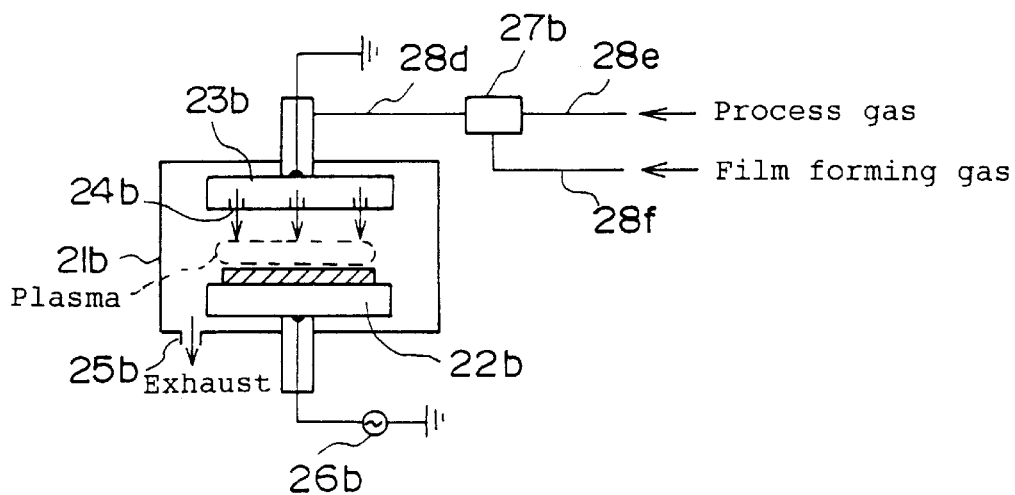

FIG. 3B shows a parallel plate type plasma equipment of cathode coupling system. A lower electrode 22b and an upper electrode 23b are provided so as to oppose to each other. In contrast to the plasma equipment in FIG. 3A, the upper electrode 23b is grounded and a high frequency power supply 26a of a frequency of 13.56 MHz or 100 kHz is connected to the lower electrode 22b. A gas piping 28d is connected to a chamber 21b. A gas switching means 27b is provided to the gas piping 28d to switch its connection to either a process gas introducing piping 28e or a film forming gas introducing piping 28f. Conversely to the case in FIG. 3A, since plasma is generated near to the substrate 101, ions are accelerated by the sheath voltage to enter into the surface of the substrate 101. Accordingly, physical etching would be effected dominantly.

Figure 3C:
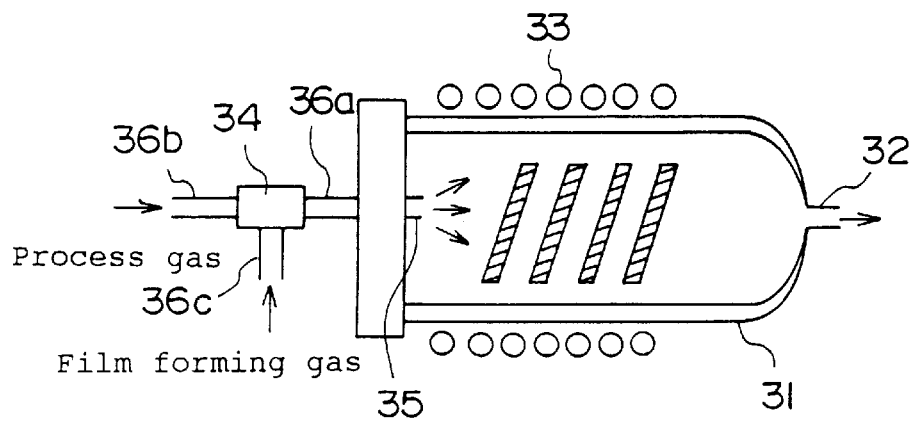

FIG. 3C shows a floating type plasma equipment of coil induction system. A lateral reaction chamber 31 is provided and a coil 33 is wound on an outer peripheral portion of the reaction chamber 31. Gases being introduced into the reaction chamber 31 can be plasmanized by electromagnetic waves which are generated from the coil 33. A gas piping 36a is connected to the reaction chamber 31. A gas switching means 34 is provided to the gas piping 36a to switch its connection to either a process gas introducing piping 36b or a film forming gas introducing piping 36c. Thus the substrate 101 is exposed to plasma, nevertheless it is electrically floated. Consequently, the substrate 101 is not self-biased by plasma so that ion impact would not attack the surface of the substrate 101. Accordingly, chemical etching would be effected.

Figure 3D:
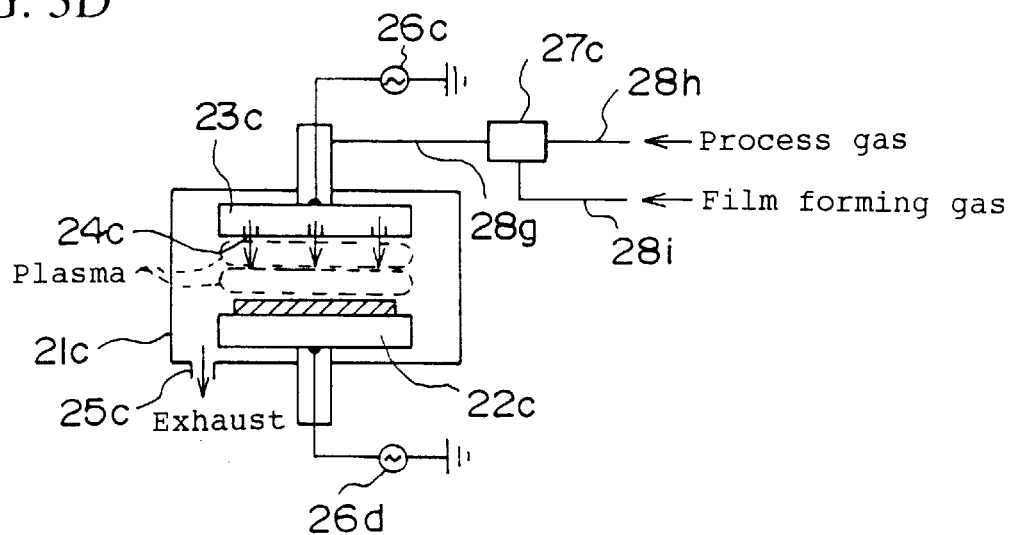

FIG. 3D shows a parallel plate type plasma equipment of double frequency excitation system. A lower electrode 22c and an upper electrode 23c are provided so as to oppose to each other. A high frequency power supply 26d of a frequency of 380 kHz is connected to the lower electrode 22c whereas a high frequency power supply 26c of a frequency of 13.56 MHz is connected to the upper electrode 23c. A gas piping 28g is connected to a chamber 21c. A gas switching means 27c is provided to the gas piping 28g to switch its connection to either a process gas introducing piping 28h or a film forming gas introducing piping 28i. As a result, etching would be effected such that both features of the plasma equipments in FIGS. 3A and 3B are rendered possible, i.e., both chemical and physical etchings would be effected simultaneously. In addition, since high frequency powers supplied to both electrodes 22c, 23c may be adjusted independently, both chemical and physical etchings can be controlled to the same extent simultaneously, or else either of chemical and physical etchings can be dominantly controlled independently.

(First Embodiment)

Figure 4:
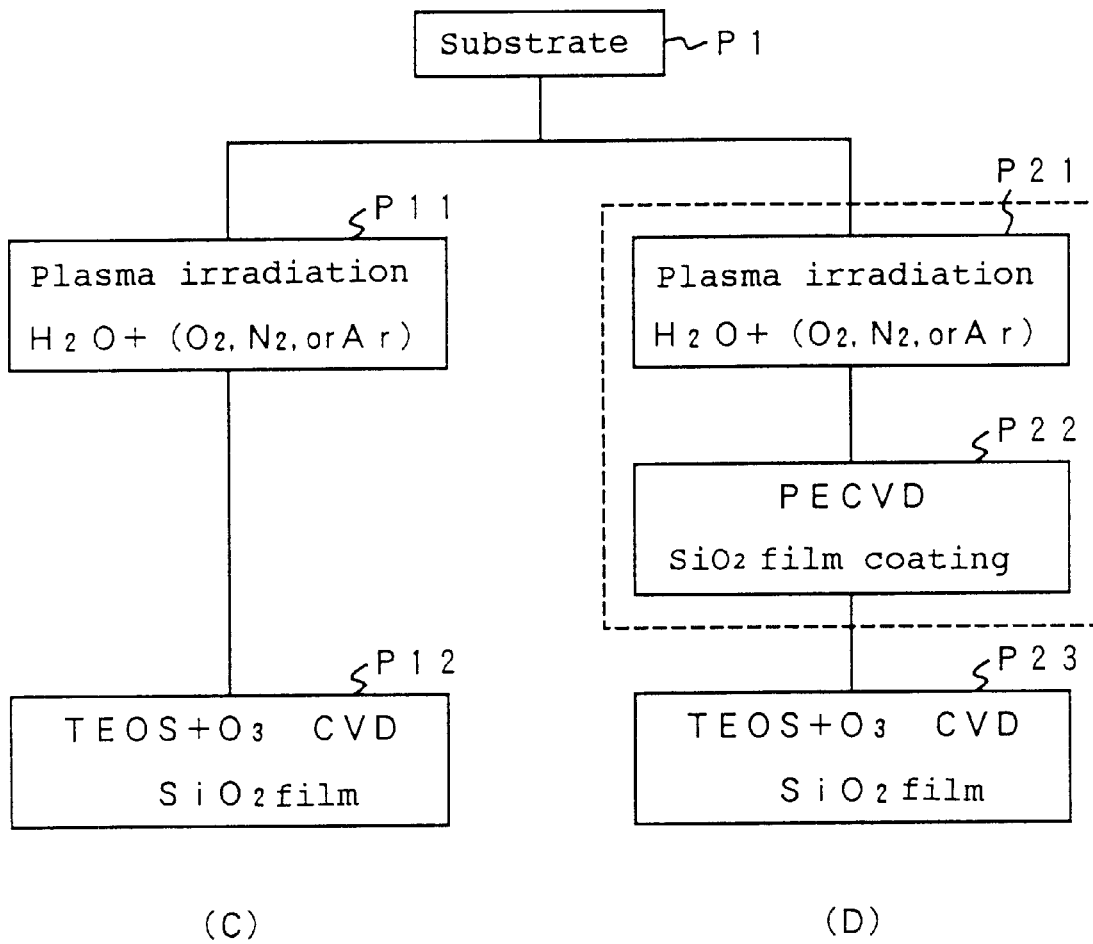
FIG. 4 is a flowchart illustrative of a film forming pre-treatment method and a semiconductor device manufacturing method according to first and second embodiments of the present invention.
Figure 5A:
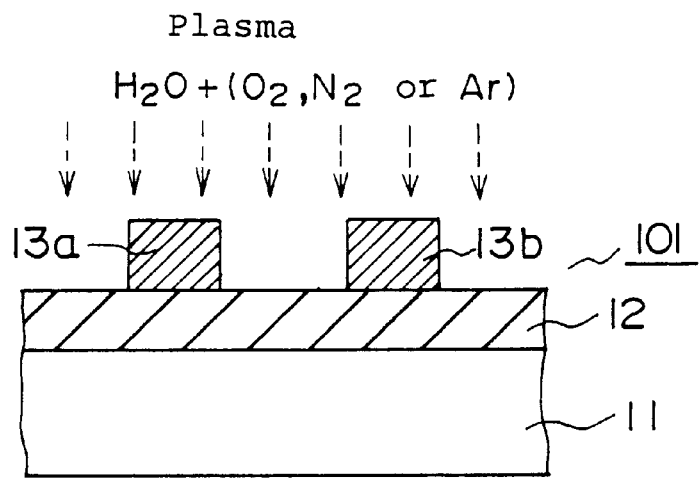
FIGS. 5A to 5C are sectional views showing the film forming pre-treatment method and the semiconductor device manufacturing method according to the first embodiment of the present invention.
Figure 5B:
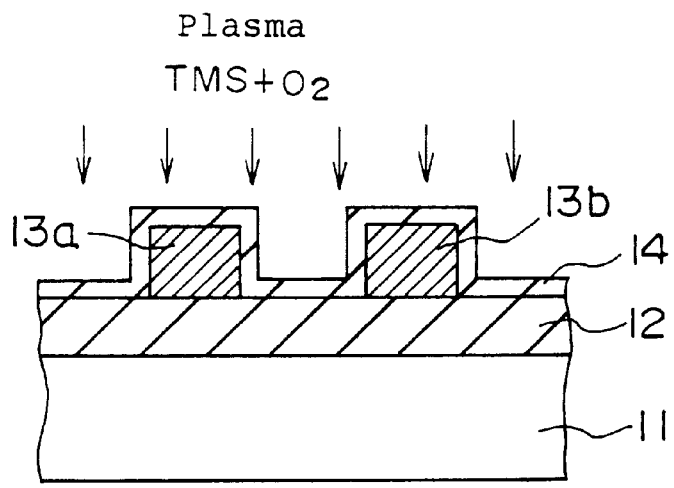
Figure 5C:
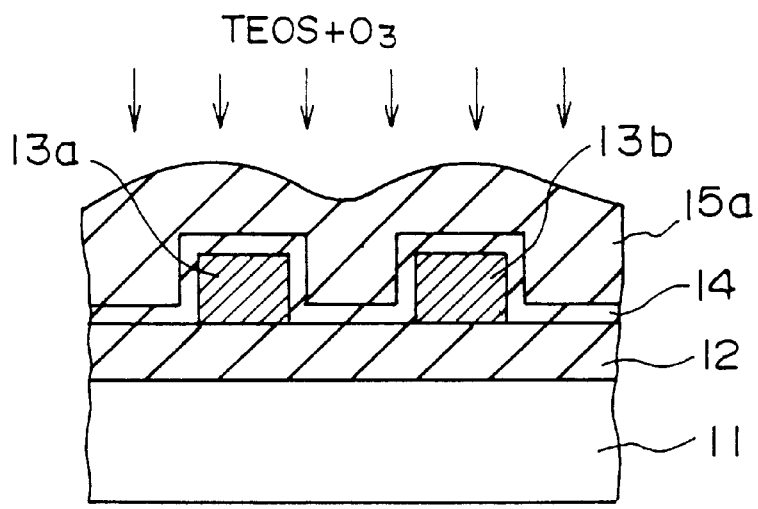

A film forming pre-treatment method according to a first embodiment of the present invention will be explained hereunder. A routine (D) of a flowchart in FIG. 4 is illustrative of working sequences which are to be executed from film forming pre-treatment to film forming completion. FIGS. 5A to 5C are sectional views showing processes from film forming pre-treatment to film forming completion.

At first, as shown in FIG. 5A, the substrate 101 is prepared for film forming process. For instance, a ground insulating film 12 made of a silicon oxide film is formed by virtue of thermal oxidation method on a semiconductor substrate 11 made of silicon, then interconnection layers (conductive films) 13a, 13b made of aluminum or aluminum alloy are formed on a resultant structure (step P1 in FIG. 4).

The substrate 101 is loaded into a chamber 21c of the plasma equipment shown in FIG. 3D, for example. An interior of the chamber 21c is then exhausted so as to reduce an inner pressure in the chamber 21c up to about $10^{-3}$ Torr. In turn, the substrate 101 is so heated that a temperature of the substrate 101 is maintained at almost 330° C.

Subsequently, a gas mixture of vapor (gaseous $H_2O$) and oxygen gas (auxiliary gas) is introduced from the process gas introducing piping 28b into the chamber 21c. At that time, a flow rate of the vapor is selected as 100 cc and a flow rate of the oxygen gas is selected as 900 cc. A pressure in the chamber 21c must be held in the range of 0.5 to 2 Torr.

Then, if a high frequency power with electric power of 150 W and frequency of 13.56 MHz is applied to the upper electrode 23c and simultaneously a high frequency power with electric power of 150 W and frequency of 380 kHz is applied to the lower electrode 22c, plasma of the process gas can be generated. Since a surface of the substrate 101 is to be exposed to such plasma, the substrate 101 is held as it is. If plasma is irradiated for about 30 seconds, contaminant can be removed from the surface of the substrate 101. Thereby, film forming pre-treatment can be completed (step P21). In the event that oxygen to which no moisture is added is supplied, it takes 30 minutes or more to remove contaminant from the surface of the substrate 101.

Next, in order to form the insulating film by virtue of plasma CVD method, the substrate 101 is left as it is in the chamber 21c with keeping exhausting after supply of the process gas has be terminated. This is because the cleaned surface of the substrate 101 can be maintained as it is.

Then, as will be explained in the following, a silicon oxide film is formed by virtue of plasma CVD method on the substrate 101 which has been treated according to the above film forming pre-treatment, and then a silicon oxide film is formed by virtue of thermal CVD method using the reaction gas including organic silane and ozone thereon.

First, oxygen containing gas, e.g., $N_2O$ and organic silane, e.g., TMS (trimethoxysilane: $HSi(OCH_3)_3$) are introduced via the film forming gas introducing piping 28i into the chamber 21c of the plasma equipment employed in the film forming pre-treatment. Respective flow rates of the oxygen containing gas and the organic silane are set to 300 to 1500 sccm and 10 to 50 sccm respectively. A pressure in the chamber 21c must be held in the range of 0.5 to 1 Torr.

Then, a high frequency power with electric power of 150 W and frequency of 13.56 MHz is applied to the upper electrode 23c and also a high frequency power with electric power of 150 W and frequency of 380 kHz is applied to the lower electrode 22c, so that plasma of the film forming gas can be generated. As shown in FIG. 5B, because the surface of the substrate 101 is exposed to plasma, the substrate 101 is held for a predetermined time as it is. As a result, a silicon oxide film 14 is formed on the surface of the substrate 101 to have a thickness of 100 nm (step P22).

The reason why, prior to formation of a $TEOS/O_3$ film by virtue of plasma CVD method, the surface of the substrate 101 has to be covered with the insulating film by virtue of plasma CVD method will be given as follows. That is, in the situation that both the metal film and the thermal oxide film are exposed on the surface of the substrate 101, if the insulating film is formed directly on such surface by virtue of thermal CVD method, the insulating film having a uniform thickness cannot be formed on the ground metal film and the thermal oxide film because of their different surface dependency. However, surface dependency can be made uniform by covering the surface of the substrate 101 with the insulating film by virtue of plasma CVD method and as a result the insulating film can be formed to have a uniform thickness.

In turn, the substrate 101 is unloaded from the chamber 21c and then loaded into the chamber of the thermal CVD equipment (not shown). Then, the substrate 101 is heated and a temperature of the substrate 101 is maintained at 400° C.

Subsequently, oxygen containing gas which includes 5% ozone in oxygen and is supplied at a flow rate of 7.5 SLM and organic silane which is included in nitrogen gas supplied at a flow rate of 1 SLM, e.g., TEOS (tetraethylorthosilicate: $Si(OC2H5)4$) are introduced into the chamber.

Then, as shown in FIG. 5C, the substrate 101 is held for a predetermined time as it is. As a result, a silicon oxide film 15a of about 800 nm thickness is formed by virtue of thermal CVD method on the silicon oxide film 14 which is formed by virtue of plasma CVD method (step P23).

As stated earlier, in case the silicon oxide film 14 is formed by virtue of plasma CVD method on the substrate 101 which has been subjected to plasma irradiation process according to the present invention and thereafter the silicon oxide film 15a is formed by virtue of thermal CVD method thereon, there has been found no abnormal shape, as shown in FIGS. 1A to 1E, of the silicon oxide film 15a formed by virtue of thermal CVD method.

(Second Embodiment)

Figure 6A:
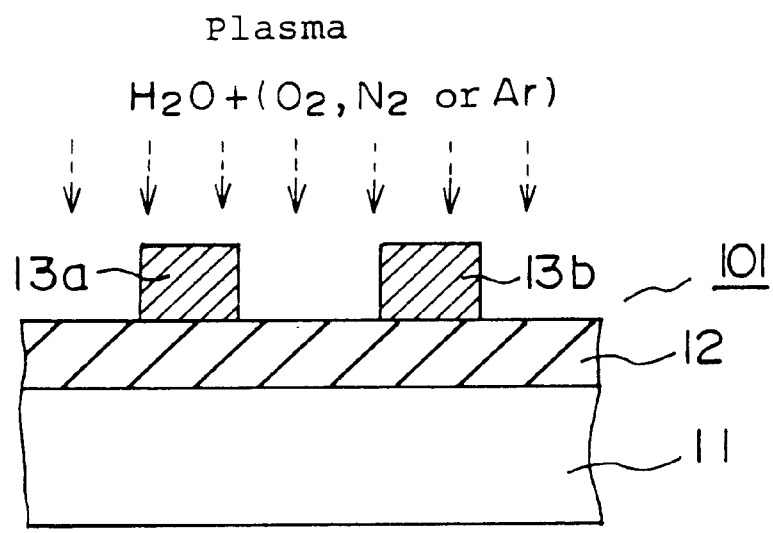
FIGS. 6A and 6B are sectional views showing the film forming pre-treatment method and the semiconductor device manufacturing method according to the second embodiment of the present invention.
Figure 6B:
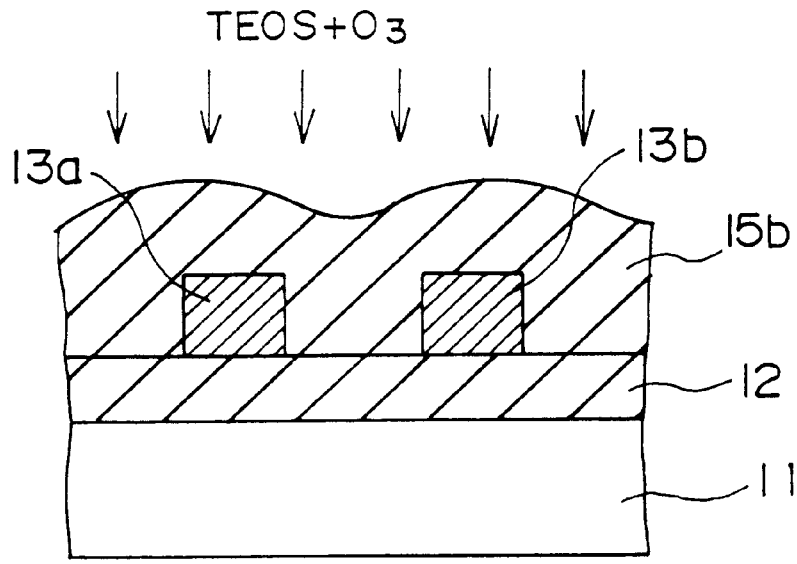

A semiconductor device manufacturing method according to a second embodiment of the present invention will be explained hereunder. A routine (C) of the flowchart in FIG. 4 is illustrative of working sequences which are to be executed from film forming pre-treatment to film forming completion. FIGS. 6A and 6B are sectional views showing manufacturing steps from film forming pre-treatment to film forming completion.

As shown in FIGS. 6A and 6B, in the second embodiment, the insulating film is not formed by virtue of plasma CVD method using only the plasma irradiation process (step P11) which has been explained in the first embodiment, but a silicon oxide film 15b is formed directly by virtue of thermal CVD method on the substrate 101 (step P12).

Except that a manufacturing step of forming the insulating film by virtue of plasma CVD method will be omitted, the same manufacturing steps and the same manufacturing conditions as those in the first embodiment are employed.

There has been detected no abnormal shape, as shown in FIGS. 1A to 1E, of the silicon oxide film 15b formed by virtue of thermal CVD method. In this manner, it is feasible to suppress surface dependency only by plasma irradiation process employing the gas including moisture.

(Comparative Example)

Figure 2:
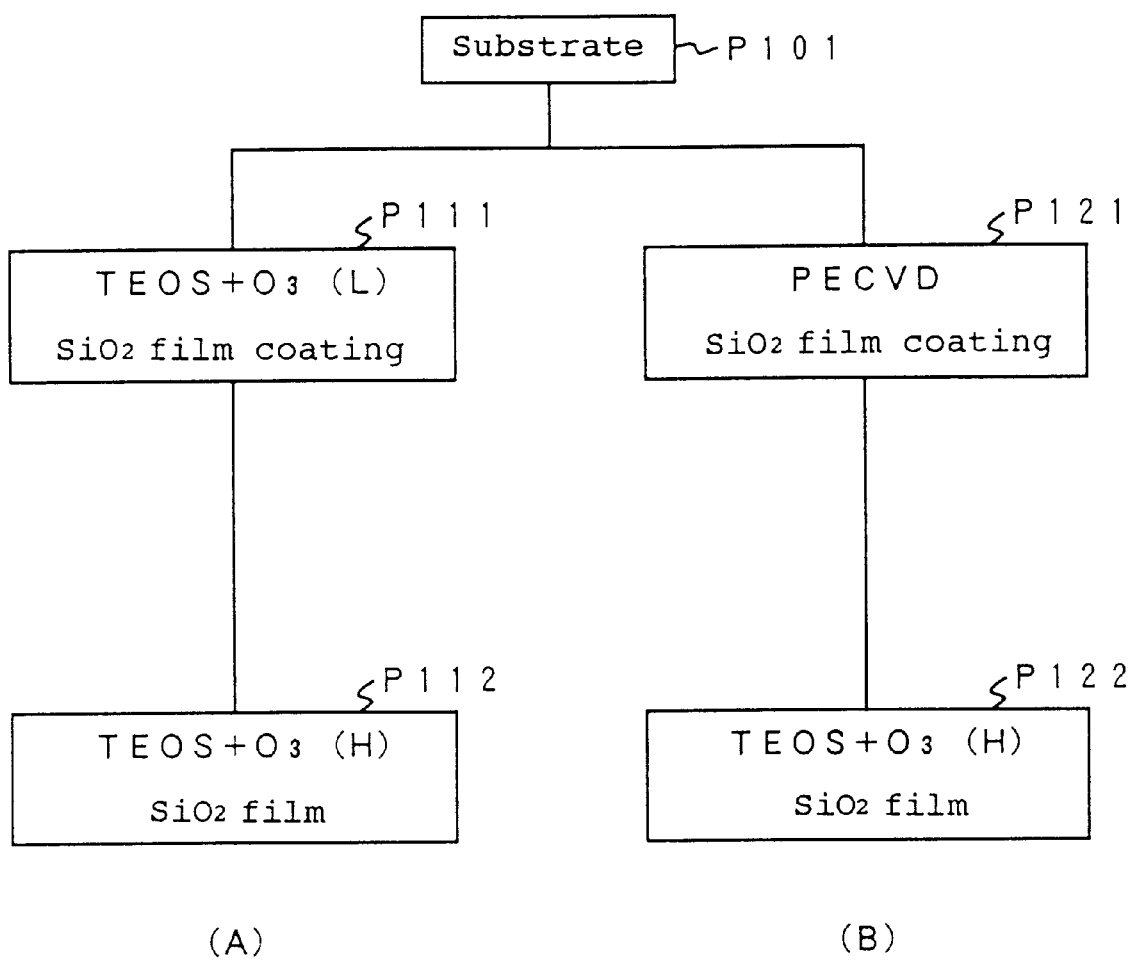
FIG. 2 is a flowchart illustrative of the film forming pre-treatment method and the semiconductor device manufacturing method in the prior art.

The silicon oxide film is formed by virtue of plasma CVD method on the substrate which is not subjected to plasma irradiation process, and then the silicon oxide film is formed by virtue of thermal CVD method thereon. That is, this situation corresponds to the routine (B) shown in FIG. 2.

Figure 1C:
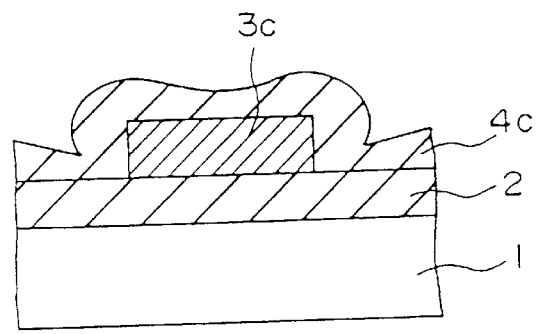
Figure 1D:
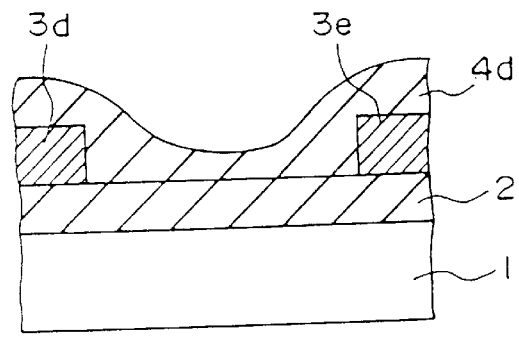
Figure 1E:
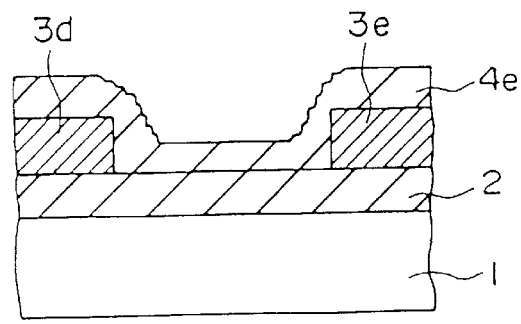

In the silicon oxide film formed according to the above thermal CVD method, abnormal shapes shown in FIGS. 1C to 1E have appeared. These events indicate that either an uneven charge distribution phenomenon or micro contamination on the surface of the substrate cannot be removed merely by coating of the insulating film according to plasma CVD method.

With the above description, according to the film forming pre-treatment method of the first and second embodiments of the present invention, contaminant can be removed from the surface of the substrate 101 since the film forming pre-treatment for the surface of the substrate 101 is carried out by using the process gas including gaseous moisture.

Therefore, it is possible to improve shapes of the silicon oxide films 15a, 15b which are formed, by virtue of thermal CVD method employing a gas mixture of organic silane and oxygen containing gas, directly on the substrate 101 or via the silicon oxide film 14 formed on the substrate 101 by virtue of plasma CVD method.

In the above first and second embodiments, vapor has been used as gaseous $H_2O$ to be used in the film forming pre-treatment, but such gaseous $H_2O$ is not limited to vapor.

In addition, although a rate of vapor to the process gas being a gas mixture of oxygen gas and vapor is set 10% in the flow rate ratio, the rate of vapor is not limited to such ratio. It is preferable from viewpoints of remarkable removing effect, stability of plasma, etc. that the rate of vapor would be set to 5 to 30% in the flow rate ratio. However, 100% vapor only may be employed, or the rate of vapor may be set to about 1% in the flow rate ratio. Moisture is included only on the order of ppm in the purified gas which is used in the ordinary wafer process and into which no vapor is added.

Further, although oxygen gas has been employed as the auxiliary gas which is added to vapor, either $N_2O$ or inert gas such as nitrogen gas, argon gas, etc. may be used. These gases can serve to stabilize plasma discharge. Moreover, according to difference in gas property, respective gases may achieve following advantages in addition to stabilization of plasma discharge. In other words, oxygen gas may remove organic substances from the surface of the substrate 101, and nitrogen gas and argon gas may cause surface cockling to remove —OH groups from the surface of the substrate 101, especially the surface of the silicon oxide film (ground insulating film) 12 so that the quality of the surface of the substrate 101 can be improved to be changed from hydrophile property to hydrophobic property.

Still further, although a temperature of the substrate 101 is set to 330° C. in cleaning process, it is not limited to such particular temperature. The substrate temperature of 250 to 350° C. is preferable from a viewpoint of short processing time, but substrate heating may merely accelerate contaminant removing reaction in the present invention since the remarkable advantage can be achieved only by including moisture in the process gas in contrast to the case where moisture is not included in the process gas. Therefore the present invention may be applied at room temperature or lower.

In the foregoing description, the plasma irradiation process of the present invention has been applied to the case where the silicon oxide films 15a, 15b are formed by virtue of thermal CVD method using a gas mixture of TEOS and ozone as the reaction gas. However, the present invention may be applied to a silicon oxide film which is to be formed by virtue of thermal CVD method using a gas mixture of other organic silane and oxygen containing gas (ozone ($O_3$), oxygen ($O_2$), $N_2O$, $NO_2$, CO, $CO_2$ or $H_2O$) or to a silicon containing insulating film which includes impurity such as boron or phosphorous. Where other organic silane is selected from the group consisting of, for example, alkylsilane or allylsilane (general formula: $R_nSiH_{4-n}$ (n=1 to 4)), alkoxysilane (general formula: $(RO)_nSiH_{4-n}$ (n=1 to 4)), chain siloxane (general formula: $R_nH_{3-n}SiO(R_kH_{2-k}SiO)_mSiH_{3-n}R_n$ (n=1 to 3; k=0 to 2; m≧0)), derivative of chain siloxane (general formula: $(RO)_nH_{3-n}SiOSiH_{3-n}(OR)_n$ (n=1 to 3)), and ring siloxane (general formula: $(R_kH_{2-k}SiO)_m$ (k=1, 2; m≧2)) (where R is alkyl group, allyl group, or their derivative).

As stated previously, in the present invention, gaseous $H_2O$ is plasmanized and then film forming pre-treatment of the surface of the substrate is carried out by the plasma. Thus, contaminant can be removed readily from the surface of the substrate.

Therefore, surface dependency of the surface of the substrate can be improved. As a result, if the silicon containing film is formed by virtue of thermal CVD method directly on the substrate or via the silicon containing insulating film formed by virtue of plasma CVD method on the substrate, a thickness of the silicon containing insulating film can be made uniform and a shape thereof can be improved.

Various modifications will become possible for those skilled in the art after receiving the teachings of the present disclosure without departing from the scope thereof.

What is claimed is:

1. A semiconductor device manufacturing method comprising the steps of:

plasmanizing a process gas to form a plasmanized process gas, said process gas containing gaseous $H_2O$ and an auxiliary gas which stabilizes the plasma state of said plasmanized process gas;

exposing a surface of a silicon substrate to said plasmanized process gas, said surface of said silicon substrate being a silicon oxide film formed by thermal oxidation of said silicon substrate; and subsequent to said exposing, depositing a silicon containing insulating film directly on said exposed surface of said silicon substrate by heating to react a film forming gas including an organic silane and an oxygen containing gas.

2. A semiconductor device manufacturing method according to claim 1, wherein said organic silane is a gas selected from the group consisting of alkylsilane or allylsilane (general formula: $R_nSiH_{4-n}$ (n=1 to 4)), alkoxysilane (general formula: $(RO)_nSiH_{4-n}$ (n=1 to 4)), chain siloxane (general formula: $R_nH_{3-n}SiO(R_kH_{2-k}SiO)_mSiH_{3-n}R_n$ (n=1 to 3; k=0 to 2; m≧0)), derivative of chain siloxane (general formula: $(RO)_nH_{3-n}SiOSiH_{3-n}(OR)_n$ (n=1 to 3)), and ring siloxane (general formula: $(R_kH_{2-k}SiO)_m$ (k=1, 2; m≧2)) (where R is alkyl group, allyl group, or their derivative).

3. A semiconductor device manufacturing method according to claim 1, wherein said oxygen containing gas is a gas selected from the group consisting of ozone ($O_3$), oxygen ($O_2$), $N_2O$, $NO_2$, CO, $CO_2$, and $H_2O$.

4. A semiconductor device manufacturing method according to claim 1, wherein said auxiliary gas is a gas selected from the group consisting oxygen ($O_2$), $N_2O$, nitrogen ($N_2$), and other inert gases.

5. A semiconductor device manufacturing method according to claim 1, wherein said gaseous $H_2O$ is at least 1% of said process gas in terms of a flow rate ratio of said gaseous $H_2O$ to process gas.

6. A semiconductor device manufacturing method according to claim 1, wherein said gaseous $H_2O$ is more than 5% and less than 30% of said process gas in terms of a flow rate ratio of said gaseous $H_2O$ to process gas.

7. A semiconductor device manufacturing method according to claim 1, further comprising heating said silicon substrate while said surface of said silicon substrate is exposed to said plasmanized process gas.

8. A semiconductor device manufacturing method according to claim 7, wherein said silicon substrate is heated to 250 to 350° C. while said surface of said silicon substrate is exposed to said plasmanized process gas.

9. A semiconductor device manufacturing method according to claim 1, wherein said substrate includes a ground insulating film as a surface layer which receives the depositing of said insulating film.

10. A semiconductor device manufacturing method according to claim 9, wherein said ground insulating film is a silicon containing insulating film.

11. A semiconductor device manufacturing method according to claim 9, further comprising forming a conductive film which is patterned on said ground insulating film.

12. A semiconductor device manufacturing method according to claim 11, wherein said conductive film is selected from the group consisting of an aluminum film, an aluminum alloy film, a refractory metal film, and a semiconductor film, and wherein said insulating film is a silicon containing insulating film.

13. A semiconductor device manufacturing method according to claim 1, further comprising depositing an insulating film by plasma enhanced CVD on said silicon substrate intermediate said exposing and thermal deposition steps.

14. A semiconductor device manufacturing method according to claim 13, wherein said auxiliary gas is a gas selected from the group consisting oxygen ($O_2$), $N_2O$, nitrogen ($N_2$), and other inert gases.

15. A semiconductor device manufacturing method comprising the steps of:

plasmanizing a process gas to form a plasmanized process gas, said process gas containing gaseous $H_2O$ and an auxiliary gas which stabilizes the plasma state of said plasmanized process gas;

exposing a surface of a silicon substrate to said plasmanized process gas, said surface of said silicon substrate being a silicon oxide film formed by thermal oxidation of said silicon substrate; and subsequent to said exposing, depositing an insulating film by plasma CVD directly on said exposed surface of said silicon substrate; and thermal depositing a silicon containing insulating film on said insulating film by heating to react a film forming gas including an organic silane and an oxygen containing gas.

16. A semiconductor device manufacturing method according to claim 15, wherein said organic silane is a gas selected from the group consisting of alkylsilane or allylsilane (general formula: $R_n SiH_{4-n}$ (n=1 to 4)), alkoxysilane (general formula: $(RO)_n SiH_{4-n}$ (n=1 to 4)), chain siloxane (general formula: $R_n H_{3-n} SiO(R_k H_{2-k} SiO)_m SiH_{3-n} R_n$ (n=1 to 3; k=0 to 2; m$\geq$0)), derivative of chain siloxane (general formula: $(RO)_n H_{3-n} SiOSiH_{3-n}(OR)_n$ (n=1 to 3)), and ring siloxane (general formula: $R_k H_{2-k} SiO)_m$ (k=1, 2; m$\geq$2)) (where R is alkyl group, allyl group, or their derivative).

17. A semiconductor device manufacturing method according to claim 15, wherein said oxygen containing gas is a gas selected from the group consisting of ozone ($O_3$), oxygen ($O_2$), $N_2O$, $NO_2$, CO, $CO_2$, and $H_2O$.

* * * * *